United States Patent [19]
Parker et al.

[11] Patent Number: 5,633,785
[45] Date of Patent: May 27, 1997

[54] INTEGRATED CIRCUIT COMPONENT PACKAGE WITH INTEGRAL PASSIVE COMPONENT

[75] Inventors: Robert H. Parker, Oakton, Va.; Richard J. Pommer, Canyon, Calif.

[73] Assignee: University of Southern California, Los Angeles, Calif.

[21] Appl. No.: 367,460

[22] Filed: Dec. 30, 1994

[51] Int. Cl.$^6$ .................. H05K 1/16; H01L 29/8605; H01L 29/92
[52] U.S. Cl. .................. 361/766; 257/528; 257/531; 257/532; 257/536; 361/765; 361/782
[58] Field of Search .................. 174/52.1, 52.4; 257/528–533, 535, 536, 537, 541, 543, 684, 924; 361/301.4, 306.1, 306.3, 312, 313, 765, 766, 782, 821; 439/68, 69, 70, 71; 437/209, 219; 29/832

[56] References Cited

U.S. PATENT DOCUMENTS

| | | | |
|---|---|---|---|
| 3,566,203 | 2/1971 | Maguire et al. | 257/723 |
| 4,744,008 | 5/1988 | Black et al. | 361/386 |
| 4,945,399 | 7/1990 | Brown et al. | 257/723 |
| 4,949,163 | 8/1990 | Sudo et al. | 257/723 |
| 4,984,065 | 1/1991 | Sako | 257/723 |
| 4,994,895 | 2/1991 | Matsuzaki et al. | 257/723 |
| 5,049,979 | 9/1991 | Hashemi et al. | 257/523 |
| 5,055,966 | 10/1991 | Smith et al. | 361/321 |
| 5,119,172 | 6/1992 | Cho et al. | 257/723 |
| 5,148,265 | 9/1992 | Khandros et al. | 257/723 |
| 5,148,266 | 9/1992 | Khandros et al. | 257/723 |
| 5,281,846 | 1/1994 | Kaiser | 257/676 |
| 5,311,057 | 5/1994 | McShane | 257/532 |

FOREIGN PATENT DOCUMENTS

| | | | |
|---|---|---|---|
| 0493967 | 7/1992 | European Pat. Off. | 257/532 |
| 59-181046 | 10/1984 | Japan | 257/531 |
| 61-137335 | 6/1986 | Japan | 437/219 |
| 2-150055 | 6/1990 | Japan | 257/531 |
| 3-22470 | 1/1991 | Japan | 257/532 |
| 4-186667 | 7/1992 | Japan | 257/531 |
| 5-251635 | 9/1993 | Japan | 257/532 |
| 5-326838 | 12/1993 | Japan | 257/532 |

*Primary Examiner*—Donald Sparks
*Attorney, Agent, or Firm*—Oppenheimer Poms Smith

[57] ABSTRACT

A high-performance, high-density integrated circuit component package includes an IC chip having a plurality of IC bond pads and an interconnect substrate overlying the IC chip. The interconnect substrate includes a plurality of I/O surface pads arrayed across a surface of the interconnect substrate. The I/O surface pads are electrically connected to the IC bond pads via a plurality of traces internal to the interconnect substrate. The interconnect substrate further includes at least one layer comprising capacitive, resistive or inductive material integrally formed therein.

24 Claims, 5 Drawing Sheets

INTEGRATED CIRCUIT COMPONENT PACKAGE WITH INTEGRAL PASSIVE COMPONENT

BACKGROUND OF THE INVENTION

1. Field of the Invention

The present invention relates to increased density electronic products, and in particular to high performance area array integrated circuit (IC) packages designed to achieve maximal component density and improved performance via the incorporation of integral layers such as built-in capacitive decouplers and termination resistances within an interconnect substrate of the IC package.

2. Description of the Related Art

The density of electronic products is increased by assembling ICs into smaller packages. Ideally, such packages are also low cost and provide high performance, electrical testability and environmental protection for the ICs.

The density of an IC package can be measured by the ratio of the area ("footprint") it consumes on a printed wiring board to the area of the actual silicon chip in that package. The present invention pertains inter alia to the reduction of this footprint ratio without sacrificing the primary desiderata suggested above and enumerated in greater specificity as objectives (b)–(n) below.

Two general types of component packages exist at this time: 1. Perimeter Input/Output (I/O) surface mount packages, such as: (i) Very Small Outline Packages (VSOPs); (ii) Fine Pitch Quad Flatpacks (FPQFs); and (iii) Tape Automated Bonding (TAB).

2. Area I/O packages such as: (i) Pin Grid Arrays (PGAs); and Land Grid Arrays (LGAs).

Conventionally, both types of IC packages must be increased in size in order for passive components to be added thereto. As may be readily appreciated, there is a need for I/O packages which more closely approach an ideal package where the footprint ratio equals unity. Such an ideal IC package is characterized by a board footprint approximately equal to the size of the silicon chip.

Those skilled in the art of IC packaging currently pursue the design of a high performance IC package which is characterized by the following desirable attributes:

a. Overall dimension as close to the bare IC as possible (i.e. unity or nearly unity footprint ratio);

b. Maximum Outer Lead Assembly Pitch (spacing), for optimal assembly yield and for ease of electrically testing at speed;

c. Integral, low-inductance, power supply decoupling capacitance layers which reduce switching-induced noise and improve integrated circuit electrical performance;

d. Integral resistance, capacitance layers patterned to provide individual integral components;

e. Considerably reduced inductance between the integrated circuit and the decoupling capacitance over alternatives (i.e., discrete capacitors located inside or outside the body of the package);

f. Environmental protection (i.e., encapsulation);

g. Low assembled cost and ease of manufacturability;

h. Reduce/eliminate requirements for discrete resistors or capacitors internal or external to the package;

i. Provide values and tolerances of integral resistor and capacitor components that can not be manufactured in integrated circuit processes;

j. Provide for resistor, capacitor values tuned to a specific die design integral to the package that extend the capability of the integrated circuit beyond what is possible in a single integrated circuit manufacturing process, (i.e., provide signal line termination and matching, provide analog circuits such as filters, provide mixed-signal or analog/digital functionality such as antenna matching within a single package approaching the form factor of the die);

k. Provide extended capability by joining a separately optimized and manufactured substrate to the die;

l. Reduced die area, cost, power and improved performance resulting from smaller optimized I/O drivers, lower package parasitics, terminated signalling or clock lines, reduced noise, reduced on-die power decoupling requirements;

m. Support increased integrated circuit clock frequencies in a low-cost, small form factor, easy to assembly package; and n. Also optionally provide for integral inductance layers providing the ability to form individual low-loss inductor components to support filter design or transformers for applications such as wireless systems or other analog applications.

The presently disclosed IC package and method for manufacturing the same achieve the desideratum (a) of a footprint ratio close to unity and the other even more desirable performance enhancement goals (b)–(n) recited above.

Accordingly, an object of the present invention is to provide an apparatus and method for reducing the overall IC package footprint to that of the bare IC, thereby reducing printed circuit board (PCB) costs.

Another object is to provide an IC component package with a maximum outer lead bond (OLB) pitch, for optimal assembly yield and for ease of high speed electrical testing.

Still another object is to eliminate the need for associated passive components in an IC component package via integral layers including integral capacitive, resistive and inductive layers.

An additional object is to provide an IC component package that is manufacturable at low cost from plastic films or combinations of organics, such as ceramic/silicon, and organic films.

Another object is to provide an IC component package which is designed to withstand hostile environmental conditions.

SUMMARY OF THE INVENTION

The IC component package of the present invention embodies a novel method of combining the best features of perimeter I/O packaging and area I/O packaging in such a manner as to reduce the footprint ratio and to add performance features such as built-in decoupling and termination resistances.

Generally, the present invention relates to an IC chip or die having a plurality of Inner Lead Bond (ILB) pads extending around its outer periphery and an overlying interconnect substrate upon which are arrayed a generally corresponding plurality of Outer Lead Bond (OLB) pads which are electrically connected to the ILB pads and provide accessible contacts for external connections.

The high-performance, high-density integrated circuit component package of the present invention includes an IC chip having a plurality of IC bond pads and an interconnect substrate overlying the IC chip. The interconnect substrate includes a plurality of I/O surface pads arrayed across a surface of the interconnect substrate. The I/O surface pads are electrically connected to the IC bond pads via a plurality of traces internal to the interconnect substrate. The interconnect substrate further includes at least one layer comprising capacitive, resistive or inductive material integrally formed therein.

An important aspect of the present invention is that the spacing between the OLB pads is maximized, thereby increasing their accessibility. The OLB pads are positioned in a generally rectangular array across the entire interconnect substrate such that the area of the interconnect substrate is not significantly greater than the area of the bare chip. The foregoing aspect involves a careful balancing of two conflicting goals, namely the goal of increasing the OLB pitch (spacing) to be substantially greater than the ILB pitch and the goal of not increasing the OLB pitch so much as to cause the interconnect package to have a footprint significantly greater than that of the underlying chip.

An even more important aspect of the present invention is the thin interconnect substrate that is applied to the die for the purposes of shortening the signal leads, and achieving a high-quality, low-noise power distribution and improved performance in general. The interconnect substrate includes integral layers (capacitive, resistive and inductive layers, or a combination of such layers) which provide the essential electrical characteristic environment for the die. Furthermore, power is distributed through low loss planes from the area array to the die bonding pads.

The capacitive layers decouple the IC power supply and reduce noise induced by switching transients on the signal leads. Accordingly, the die may be operated at higher clock rates because of improved signal to noise ratios. When positioned between the IC power and ground planes, the capacitive layers (e.g., thin films of high dielectric constant material) provide uniform and lower noise power distribution and capacitive decoupling.

It is further contemplated that a capacitor layer may be patterned to form individual capacitor circuit elements in an analog single chip package application. Rather than supplying external capacitors, the present invention provides discretely patterned capacitive components in the integral layers of the interconnect substrate. Such capacitors may be advantageously employed in the phase lock loops which are used within digital processor chips for clock synchronization and which often require capacitors to form the loop filters required for proper operation.

The resistive layers provide termination and damping resistors for insertion in the signal leads of high performance die. The resistor layers provide high quality, low inductance resistive components that can be used in series or in parallel or in a combination of series, parallel to the individual signal leads to match the transmission lines of the substrate to the drivers and/or receivers of the die. Such resistive components become part of the electrical circuit of the die and can be included in the optimized design of the signalling characteristics of the die.

The resistive layers comprise thin resistive films and provide high-quality, low-inductance resistive components for signal line termination and high-frequency signal matching. As may be readily appreciated, higher performance circuits may be implemented by redesigning I/O drivers and receivers around the above-described high-quality resistive components. Analog circuits such as filters, phase lock loops, or antenna matching networks for wireless systems can be designed and specifically tailored to the integrated circuit design and mounted as an integral part of the package in a form-factor approaching the size of the die.

The foregoing integral layer structure is not limited to resistive and/or capacitive layers, but also includes any material that can be processed in thin sheets and formed into a layer of the interconnect substrate. For example, magnetic material can be used, thereby allowing for the integration of discrete inductors to support analog or mixed signal applications.

DESCRIPTION OF THE DRAWINGS

Other objects, features, and advantages will become readily apparent upon reference to the following detailed description when considered in conjunction with the accompanying drawings, in which like reference numerals designate like parts throughout the figures thereof, and wherein.

DETAILED DESCRIPTION OF THE PREFERRED EMBODIMENTS

Generally, the IC component package of the present invention includes an unpackaged chip, an interconnect substrate, a wire bond, and (optionally) an environmental encapsulant. The interconnect substrate, comprised of an alumina substrate and an area interconnect, is slightly smaller than the die and is fabricated as a separate component on a thin-film or other process line and then attached to the surface of the die with a die attach material. The substrate provides several important attributes, including mapping unique perimeter die pads to an area array, highly efficient power supply bypass, low inductance power distribution, signal line termination, and a low profile, high density package that is substantially the same size as the unpackaged chip.

Figure 1:
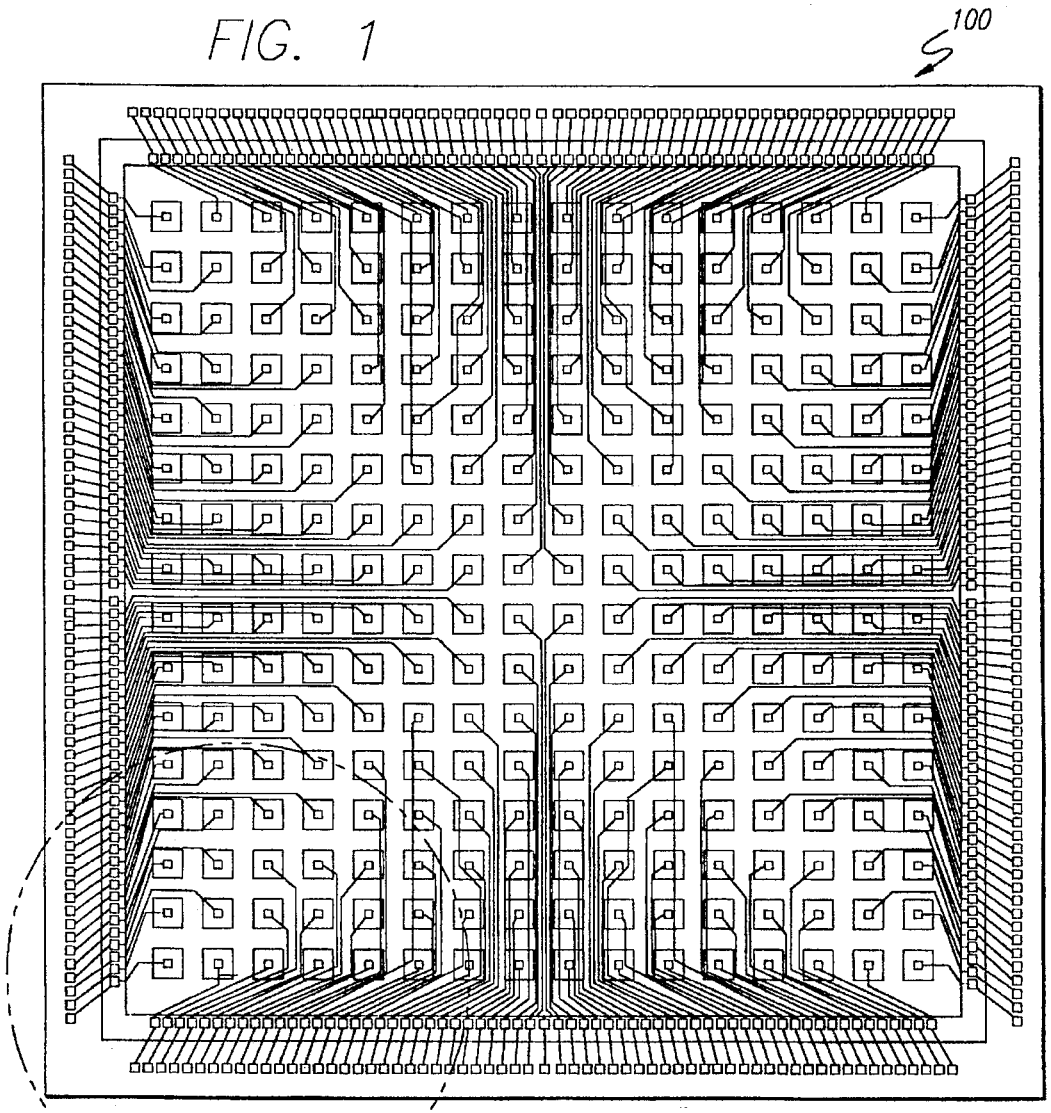
FIG. 1 is a horizontal projection from above of a 256 pad I/O area array interconnect package.

FIG. 1 shows a 256 pin microprocessor component package. The area interconnect pattern illustrated in FIG. 1 is chosen to provide the maximum package pad size for ease of assembly and test.

As discussed above, area penalties are conventionally associated with the addition of external components such as passive decoupling capacitors which are required for proper electrical operation. The addition of external components decreases the effective component packaging density which is determined by the number and size of discrete components required to support the ICs. Furthermore, high-performance applications often require the use of series or parallel termination resistors, generally surface mount components on the substrate surrounding the surface mount package, which increase the effective footprint.

An important feature of the present invention is the relocation of such external components inside the IC package, thereby reducing the footprint of the integrated circuit as well as the size and cost of the substrate.

Figure 2:
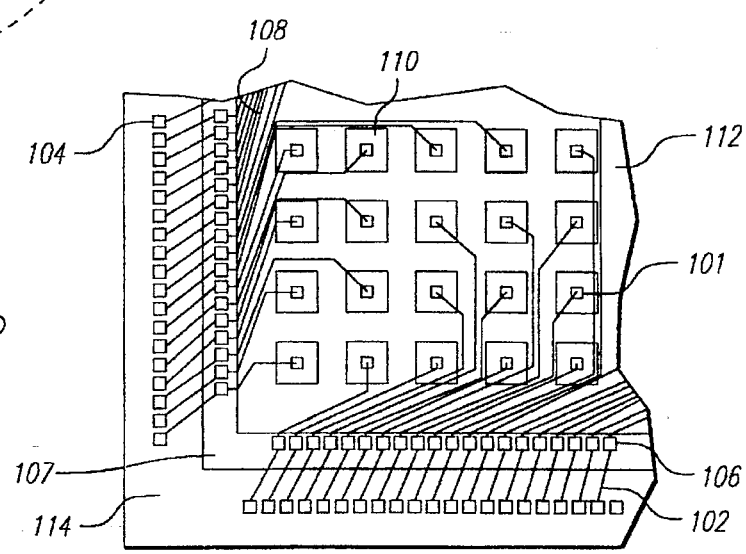
FIG. 2 is an expanded view of the lower left corner of the area array interconnect package of FIG. 1.

FIGS. 1 and 2 show a top view of a high performance area array interconnect component package 100 having 256 wire bonds or lead frames 102. The wire bonds 102 are preferably made of a highly conductive material such as gold. On a periphery of the package 100 there are four edge sets of 64 Inner Lead Bond (ILB) pads 104. The wires 102 pass through 64 substrate bond pads 106 on a peripheral bond shelf 107 of the package 100 before fanning out in traces 108 for individual connection in a uniquely prespecified pattern to a subset of one quarter of 256 surface pads 110 which are arrayed on a surface 112 of the package 100. The peripheral bond shelf 107 rests on a top 114 of the stock die. The ILB pads 104 of the stock die are electrically connected to the peripheral bond shelf 107 of an interconnect substrate 116 which is discussed more completely with reference to FIGS. 3–7.

It is important to note that the traces 108 shown in FIGS. 1 and 2 are actually internal to the interconnect substrate 116 and are merely drawn external thereto to illustrate the respective electrical interconnections between the substrate bond pads 106 and the I/O surface pads 110.

Figure 3:
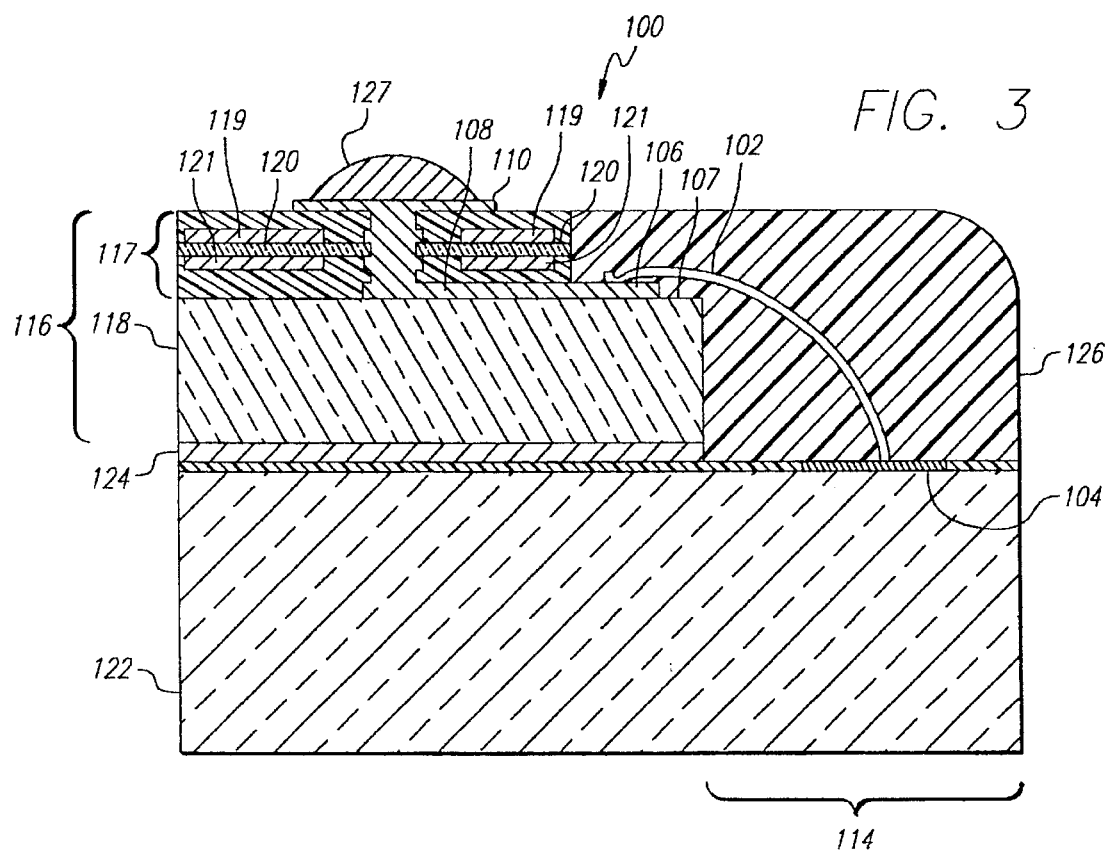
FIG. 3 is a vertical cross-sectional view of a solder-bumped area array suitable for flip-chip attachment mounted on a stock die.

FIG. 3 is a vertical cross-sectional view of a solder-bumped area array preferred embodiment suitable for flip-chip attachment. The IC package 100 includes an interconnect substrate 116 which is bonded to a surface of a die 122 by means of a die attach 124, which may be either hard or compliant. If the substrate is not coefficient of thermal expansion (CTE) matched to the die, a compliant die attach 124 is required, which is typically organic.

The interconnect substrate 116 comprises a multilayer area interconnect 117 and an underlying substrate 118 which preferably comprises alumina. The embodiment shown in FIG. 3 additionally includes a power plane 119 and a ground plane 121 which are formed within the area interconnect 117. A thin film of high dielectric constant material 120, such as tantalum oxide or barium titanate, is formed between the power plane 119 and the ground plane 121. The material 120 provides uniform power distribution and capacitive decoupling in the package, resulting in lower switching noise and high operating frequencies. Capacitances of up to 250 nanofarads/inch$^2$ between planes 119, 121 have been observed.

As will be further discussed with regard to other embodiments, additional integral layers (such as resistive or inductive layers) may be added to the multilayer area interconnect 117 to provide integral signal damping or terminating resistors in the signal leads for controlling risetime, overshoot or other electrical signal conditioning requirements.

The interconnect substrate 116 is fabricated on a conventional substrate process line (i.e. copper conductors with polyimide dielectric on an alumina or silicon substrate, metallic or low cost thin plastic films or combinations of ceramic/silicon, metallic and organic films) and formed in any of a number of ways, including sputtering deposition, evaporation, plating or molding.

The alumina substrate 118 serves as a backing plate and is required as a process carrier in the manufacture of the interconnect substrate 116. The peripheral bond shelf 107 of the interconnect substrate 116 is fabricated to match the bond pads 104 of the stock die 122, which may be in cut "singleated" die or wafer form.

In FIG. 3, the solder bumped area interconnect pads 127 are chosen to facilitate flip chip attachment. The interconnect pads 127 can also be supplied with gold or other metal finishers for mounting with an anisotropic adhesive or conductive elastomers. The use of anisotropic adhesives and conductive elastomers is feasible because the large pad areas provide much lower contact resistance, and thus higher assembly yields than could be achieved by directly connecting to the IC bond pads, resulting in much lower cost assembly.

Conventionally, discrete capacitors are mounted on top of a die package or around the package (as much as 0.5 inches away from the die bonding pads) on the next level substrate. Such externally mounted capacitors are not optimally configured to reduce transient noise because they are physically and electrically removed from the die by the inductance (proportionate to length) of the leads that attach them to the die.

The integral capacitive layers of the present invention allow the leads 102 to become extremely short because the capacitors are positioned within a few mils of the die bonding pad. The shorter leads within the interconnect substrate 116 allow power to be cleanly distributed through the low inductance capacitor plane layers (and the short leads 102) directly to the power pads on the die.

Figure 4:
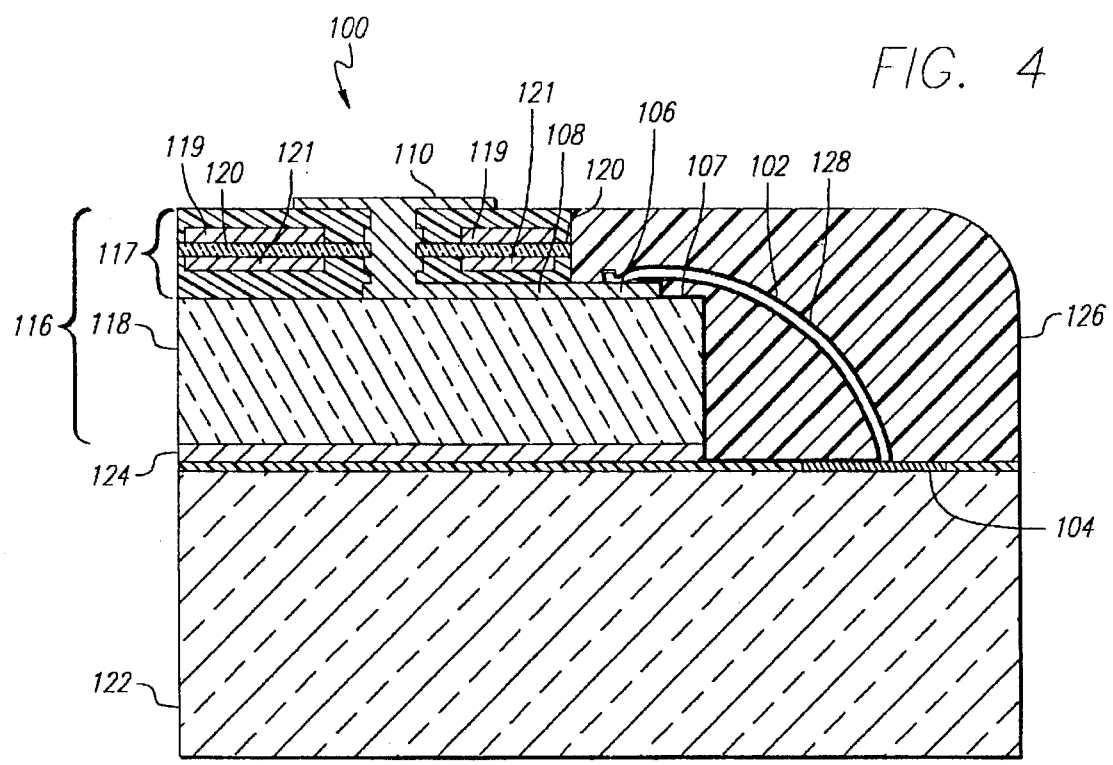
FIG. 4 is a vertical cross-sectional view of an alternative mounting, including a hermetic barrier.
Figure 5:
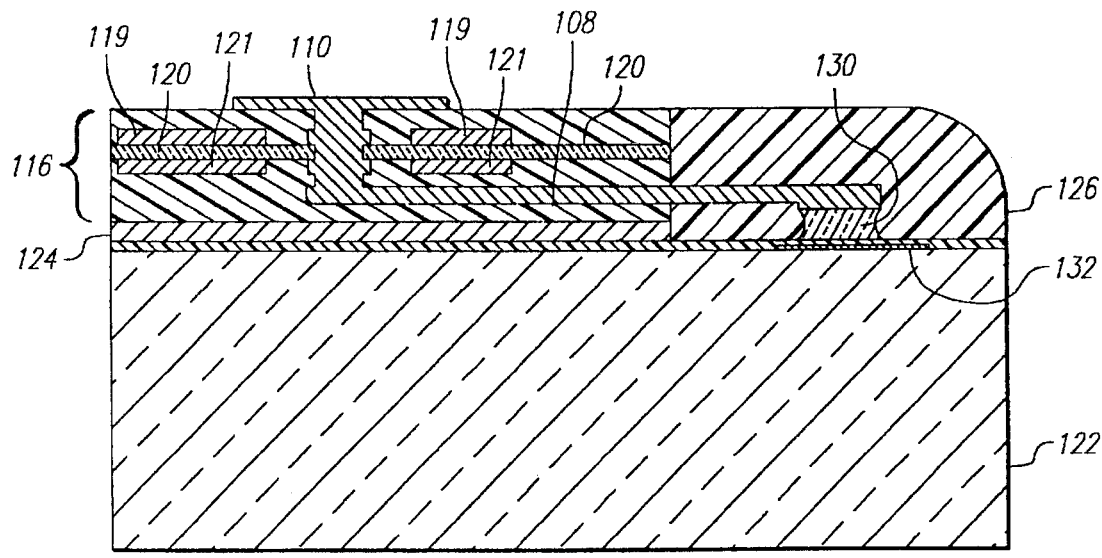
FIG. 5 is a vertical cross-sectional view of still another alternative configuration, suitable for TAB attachment.

FIGS. 4 and 5 show alternative preferred embodiments of the present invention that are configured for more stringent environmental protection and to support higher volume production, respectively.

The embodiment of FIG. 4 includes an inorganic hermetic barrier 128 applied around the wire bonds 102. The inorganic passivation layer 128 may be formed, for example, by sputtering 1 micron of silicon nitride around the exposed metal wire bonds 102 before the optional organic encapsulation 126 is formed. The passivation layer 128 increases the life of the IC component package 100, particularly in hostile environments such as military or automotive applications.

The embodiment of FIG. 5 is adapted to higher volume production. Here the die are post-processed in wafer form with metallic TAB bumps 130 and an inorganic passivation layer 132. Such additional processing provides environmental protection at the die surface and bumps 130 compatible with automated TAB bonding.

An advantageous feature of the embodiment shown in FIG. 5 is that the interconnect substrate 116 can be fabricated without the alumina backer 118 since the TAB bumps 130 facilitate bonding. Accordingly, a thinner IC package 100 can be inexpensively supported in high volume production. The IC component package of FIG. 5 provides an alternative to the wire bonds 102 used in the embodiments shown in FIGS. 3 and 4. In either case, heat is removed from the backside of the die which is left exposed during packaging.

Figure 6:
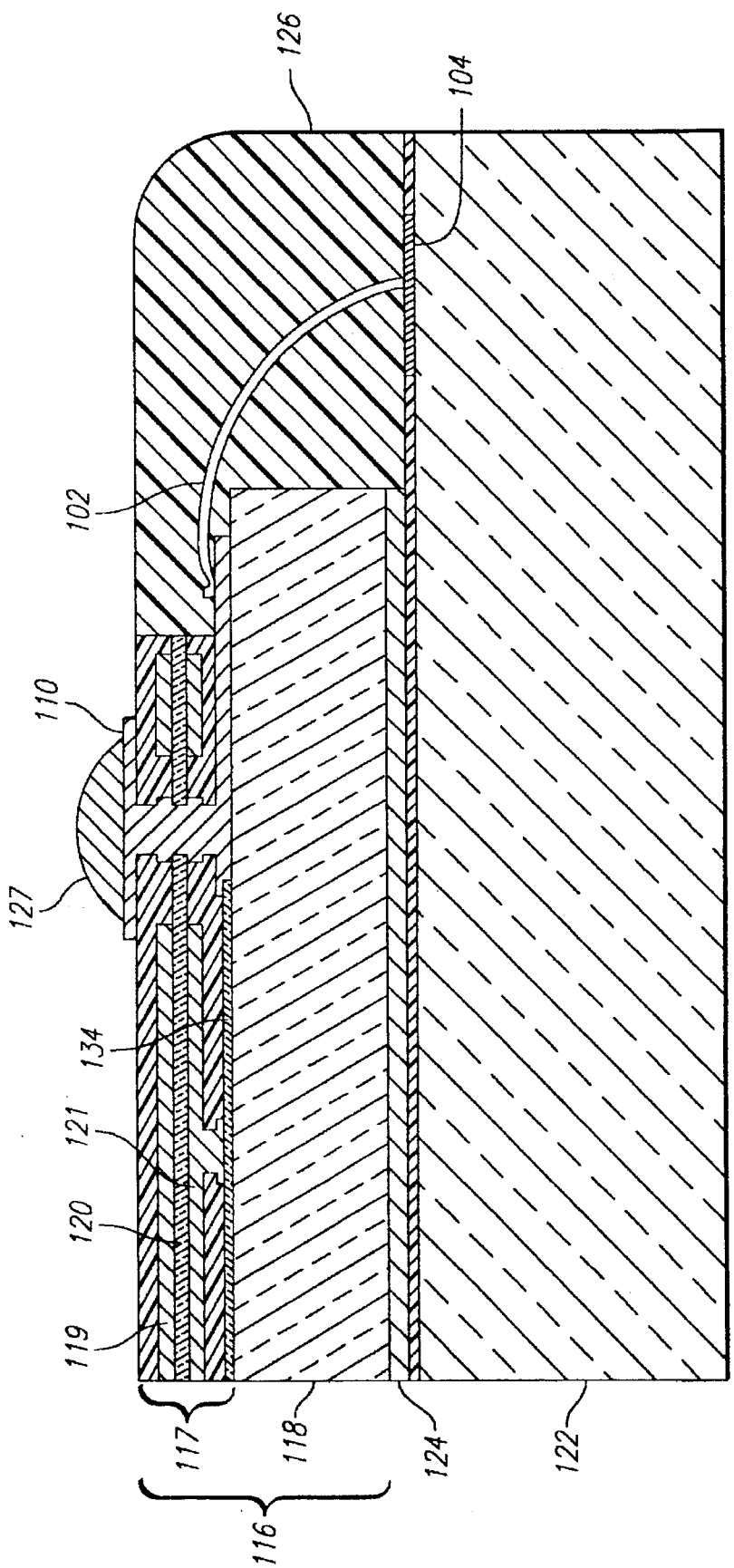
FIG. 6 is a vertical cross-sectional view of yet another alternative configuration with integral layers forming a terminal resistor and a decoupling capacitor.

FIG. 6 is a vertical cross-sectional view of yet another alternative configuration with integral layers forming a terminal resistor and a decoupling capacitor.

As with the capacitive components illustrated in FIGS. 3–5, resistive components may similarly be moved from outside the package in discrete form to inside the package in distributed plan layer form. Such internal relocation of the resistive components has the board level impact of reducing the area required for the die and its associated capacitors and resistors plus the performance improvement of removing the lead inductance from both the decoupling capacitors and the termination resistors.

FIG. 6 illustrates a resistive layer 134 which is electrically connected between the ground plane 121 and the solder bump 127. The resistive layer 134 preferably comprises a resistive film of 100Ω/inch$^2$ and serves as a termination resistor as discussed above. The capacitive layer 120 comprises a capacitive film of greater than 5 nF/cm$^2$ and preferably comprises a capacitive film of 100 mF/cm$^2$ and serves as a decoupling capacitor (25–50 V) between the power plane 119 and the ground plane 121.

The foregoing approach also reduces the power consumed by the chip because the internal package leads are shorter than alternative packages and the leads are encapsulated in a lower dielectric constant material than alternative ceramic packages. The lower dielectric constant material surrounding the leads necessarily results in a lead structure with a lower capacitance. Therefore, power dissipation is lessened during the signal lead transition state. In other words, the reduced signal lead length and lower dielectric constant material surrounding the leads reduce the power consumed by state transitions.

Resistors are often required for termination of unused signals, selection of internal die options, signal pins biasing, circuit components in either digital or analog die (e.g., in analog filter circuits), components in phase lock loop applications, current limiting protective devices, resistor ladders in A/D applications, or sensors in analog applications. The foregoing exemplary applications of the integral resistor layer structure disclosed herein are merely illustrative and are by no means to be construed as an exhaustive list of possible applications.

Figure 7:
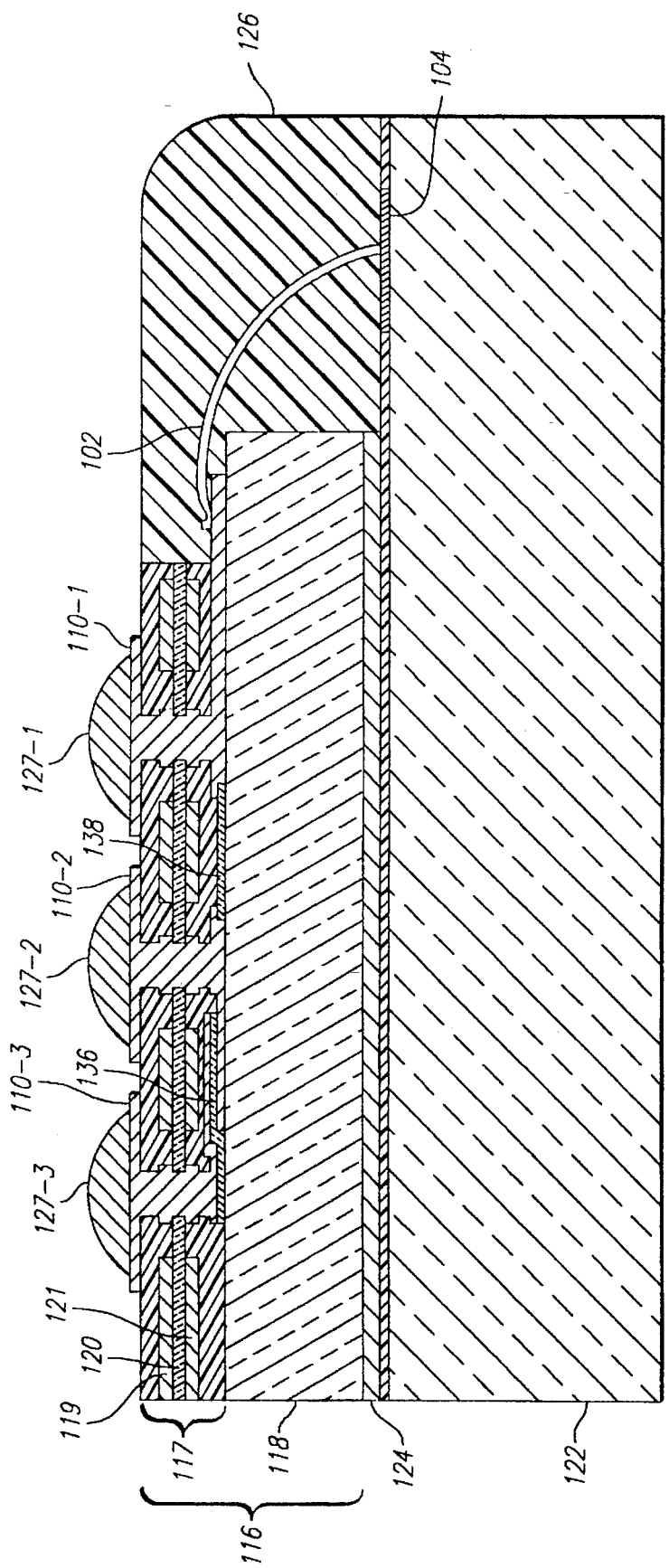
FIG. 7 is a vertical cross-sectional view of still another alternative configuration with integral layers forming discrete resistive and capacitive components.

FIG. 7 is a vertical cross-sectional view of still another alternative configuration with integral layers forming discrete resistive and capacitive components. A discrete capacitor 136 (preferably 20 pF–0.1 µF, 25 V) is electrically connected between the interconnect pads 127-2,127-3 and a discrete resistor 138 (preferably 25Ω–200 kΩ) is electrically connected between the interconnect pads 127-1, 127-2. As may be readily appreciated, discrete capacitors and resistors in the form of integral layers may be implemented in configurations other than the exemplary configuration shown in FIG. 7. Furthermore, inductive material can alternatively be employed in either of the above-described discrete component structures. Inductors may be fabricated as spiral wound copper coils (preferably 1 nH–1,000 nH).

Figure 8:
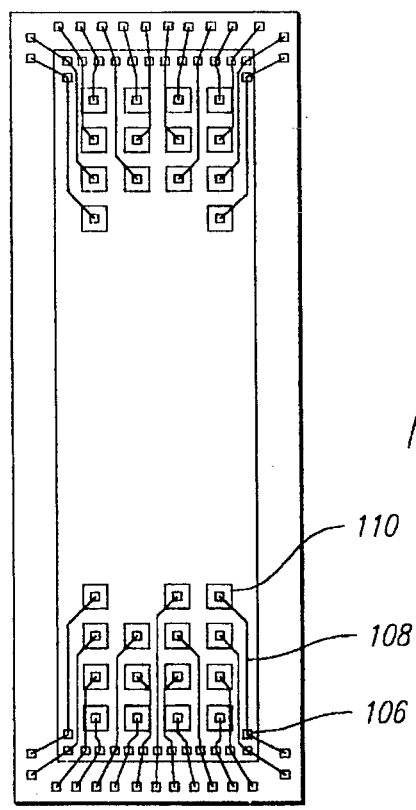
FIG. 8 is a horizontal view of a non-square alternative to the configuration depicted in FIG. 1, in this case an area array suitable for a 32K×8 Static Random Access Memory (SRAM) component package.

In conclusion, it is to be understood that the foregoing detailed description, and the accompanying drawings relate to the presently preferred illustrative embodiments of the invention. However, various changes may be made without departing from the spirit and the scope of the invention. Thus, by way of example and not of limitation, the square array case presented above may be extended to other configurations such as the rectangular Static Random Access Memory (SRAM) area array component package shown in FIG. 8. As with FIGS. 1 and 2, the traces 108 in FIG. 8 are actually internal to the interconnect substrate 116 and are only shown externally to conceptually illustrate the respective electrical interconnections between the substrate bond pads 106 and the I/O surface pads 110.

Furthermore, the present invention additionally contemplates the formation of multiple layers (or multiple independent segments of one layer) each with a separate voltage for complex digital or analog chips that require multiple power supply levels.

It is further contemplated that the alumina substrate 118 may comprise other metals, composites, plastics, or be removed entirely. Also, the encapsulation process may result in the formation of various materials that extend over the edge of the die. Accordingly, the present invention is not limited to the specific embodiments shown in the drawings and described in detail hereinabove.

What is claimed is:

1. A high-performance, high-density integrated circuit (IC) component package comprising:

an IC chip having a plurality of IC bond pads extending along an outer periphery of said IC chip;

an interconnect substrate bonded to said IC chip with a die attach, said interconnect substrate being mounted as an integral part of the component package and providing structural support to the component package, said interconnect substrate including:

a plurality of I/O surface pads arrayed across a surface of said interconnect substrate, said I/O surface pads being electrically connected to said IC bond pads via a plurality of traces internal to said interconnect substrate;

at least one layer comprising capacitive, resistive or inductive material integrally formed within said interconnect substrate, said at least one layer comprising capacitive material having a capacitance between 20 pF and 0.1 µF, said at least one layer comprising resistive material having a resistance between 25Ω and 200 kΩ, said at least one layer comprising inductive material having an inductance between 1 nH and 1,000 nH; and distinguishable power and ground planes integrally formed within said interconnect substrate; and a plurality of wire bonds between said traces and said IC bond pads.

2. The high-performance, high-density IC component package of claim 1 wherein said at least one layer includes a capacitive layer formed between said power and ground planes.

3. The high-performance, high-density IC component package of claim i wherein said at least one layer includes a capacitive layer forming a discrete capacitor.

4. The high-performance, high-density IC component package of claim 3 wherein said discrete capacitor is formed between two of said I/O surface pads.

5. The high-performance, high-density IC component package of claim 1 wherein said at least one layer includes a resistive element formed between said ground plane and one of said I/O surface pads.

6. The high-performance, high-density IC component package of claim 1 wherein said at least one layer includes a resistive layer forming a discrete resistor.

7. The high-performance, high-density IC component package of claim 6 wherein said discrete resistor is formed between two of said I/O surface pads.

8. The high-performance, high-density IC component package of claim 1 wherein said interconnect substrate comprises:

an alumina substrate formed over said IC chip; and a multilayer area interconnect formed over said alumina substrate, said multilayer area interconnect including said plurality of I/O surface pads, said surface, said plurality of traces and said at least one layer.

9. The high-performance, high-density IC component package of claim 1 further comprising:

a plurality of solder bumps electrically connected to said plurality of I/O surface pads to facilitate flip chip attachment.

10. A high-performance, high-density integrated circuit (IC) component package comprising:

an IC chip having a plurality of IC bond pads; and an interconnect substrate bonded to said IC chip with a die attach, said interconnect substrate being mounted as an integral part of the component package and providing structural support to the component package, said interconnect substrate including:

a plurality of I/O surface pads arrayed across a surface of said interconnect substrate, said I/O surface pads being electrically connected to said IC bond pads via a plurality of traces internal to said interconnect substrate; and at least one layer comprising capacitive, resistive or inductive material integrally formed within said interconnect substrate, said at least one layer comprising capacitive material having a capacitance of at least 20 pF, said at least one layer comprising resistive material having a resistance of at least 25$\Omega$, said at least one layer comprising inductive material having an inductance of at least 1 nH.

11. The high-performance, high-density IC component package of claim 10 wherein said I/O surface pads are positioned on said surface such that a spacing between said I/O surface pads is substantially greater than a spacing between said IC bond pads for easier coupling of said IC component package to external circuitry.

12. The high-performance, high-density IC component package of claim 10 wherein said interconnect substrate has an area substantially the same as an area of said IC chip.

13. The high-performance, high-density IC component package of claim 10 further wherein said interconnect substrate further comprises distinguishable power and ground planes integrally formed therein.

14. The high-performance, high-density IC component package of claim 13 wherein said at least one layer includes a capacitive layer formed between said power and ground planes.

15. The high-performance, high-density IC component package of claim 10 wherein said at least one layer includes a capacitive layer forming a discrete capacitor.

16. The high-performance, high-density IC component package of claim 15 wherein said discrete capacitor is formed between two of said I/O surface pads.

17. The high-performance, high-density IC component package of claim 10:

wherein said interconnect substrate further comprises a distinguishable ground plane integrally formed therein; and wherein said at least one layer includes a resistive element formed between said ground plane and one of said I/O surface pads.

18. The high-performance, high-density IC component package of claim 10 wherein said at least one layer includes a resistive layer forming a discrete resistor.

19. The high-performance, high-density IC component package of claim 18 wherein said discrete resistor is formed between two of said I/O surface pads.

20. The high-performance, high-density IC component package of claim 10 wherein said interconnect substrate comprises:

an alumina substrate formed over said IC chip; and a multilayer area interconnect formed over said alumina substrate, said multilayer area interconnect including said plurality of I/O surface pads, said surface, said plurality of traces and said at least one layer.

21. The high-performance, high-density IC component package of claim 10 further comprising:

a plurality of solder bumps electrically connected to said plurality of I/O surface pads to facilitate flip chip attachment.

22. The high-performance, high-density IC component package of claim 10 further comprising:

a plurality of wire bonds between said traces and said IC bond pads.

23. The high-performance, high-density IC component package of claim 22 further comprising:

an environmental encapsulant material applied over said plurality of wire bonds.

24. A method of manufacturing a high-performance, high-density integrated circuit (IC) component package comprising the steps of:

(a) providing an IC chip having a plurality of IC bond pads;

(b) separately manufacturing an interconnect substrate including at least one layer comprising capacitive, resistive or inductive material integrally formed within the interconnect substrate, said interconnect substrate including a plurality of I/O surface pads arrayed across a surface of the interconnect substrate and a plurality of traces internal to the interconnect substrate;

(c) thereafter bonding said interconnect substrate to said IC chip with a die attach; and (d) electrically connecting said I/O surface pads to said IC bond pads via said plurality of traces.

\* \* \* \* \*